United States Patent
Chen

(10) Patent No.: US 9,045,311 B2
(45) Date of Patent: Jun. 2, 2015

(54) CONTAINER FOR ACCOMMODATING CABLE THEREIN AND ELECTRONIC DEVICE ASSEMBLY WITH SAME

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Zhou Chen, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

(*) Notice: Subject to any disclaimer, the term of this patent is extended or adjusted under 35 U.S.C. 154(b) by 162 days.

(21) Appl. No.: 13/727,634

(22) Filed: Dec. 27, 2012

(65) Prior Publication Data

US 2013/0163219 A1 Jun. 27, 2013

(30) Foreign Application Priority Data

Dec. 27, 2011 (CN) .......................... 2011 1 0444414

(51) Int. Cl.

| B65H 75/30 | (2006.01) |
|---|---|
| B65H 75/48 | (2006.01) |
| H02G 11/02 | (2006.01) |
| H05K 5/00 | (2006.01) |
| H05K 7/00 | (2006.01) |
| B65H 75/44 | (2006.01) |
| H05K 5/02 | (2006.01) |
| H01R 13/72 | (2006.01) |
| H04R 1/10 | (2006.01) |

(52) U.S. Cl.

CPC .......... *B65H 75/4481* (2013.01); *H05K 5/0217* (2013.01); *B65H 75/4484* (2013.01); *H01R 13/72* (2013.01); *H02G 11/02* (2013.01); *B65H 2557/11* (2013.01); *B65H 2701/3919* (2013.01); *H04R 1/1033* (2013.01)

(58) Field of Classification Search

None
See application file for complete search history.

(56) References Cited

U.S. PATENT DOCUMENTS

| 5,762,281 | A  | * | 6/1998  | Foley .............................. 242/376 |
|---|---|---|---|---|
| 6,375,109 | B1 | * | 4/2002  | Liao ............................... 242/378 |
| 6,434,249 | B1 | * | 8/2002  | Wei ................................ 381/370 |
| 6,705,891 | B1 | * | 3/2004  | Lin ................................. 439/528 |
| 6,728,556 | B1 | * | 4/2004  | Whitley ....................... 455/575.1 |
| 7,025,298 | B2 | * | 4/2006  | Priest et al. ................. 242/388.8 |
| 7,077,693 | B1 | * | 7/2006  | Symons ........................ 439/501 |
| 7,086,512 | B2 | * | 8/2006  | Shack et al. ................. 191/12.4 |
| 7,108,216 | B2 | * | 9/2006  | Burke et al. ................. 242/378.1 |
| 7,125,282 | B2 | * | 10/2006 | Huang ........................... 439/501 |
| 7,273,192 | B2 | * | 9/2007  | Park ............................ 242/385.2 |
| 7,356,362 | B2 | * | 4/2008  | Chang et al. ............... 455/575.2 |
| 7,364,109 | B2 | * | 4/2008  | Kuo .............................. 242/373 |

(Continued)

*Primary Examiner* — Hoa C Nguyen
*Assistant Examiner* — Xanthia C Cunningham
(74) *Attorney, Agent, or Firm* — Novak Druce Connolly Bove + Quigg LLP

(57) ABSTRACT

An exemplary container for accommodating a cable of an electronic device includes a base, a cover, a winder rotatably connected to the base, a transmission piece fasten to the winder, and a driving apparatus fixed on the cover and engaging with the transmission piece. The cover is placed on the base to cover the winder and defines a receiving space in cooperation with the base to receive the winder. The driving apparatus includes a trigger. The trigger generates a shift signal to the driving apparatus each time the trigger is pressed. The driving apparatus drives the winder to rotate via the transmission piece for winding up the cable on the winder according to the shift signal.

19 Claims, 4 Drawing Sheets

(56) References Cited

U.S. PATENT DOCUMENTS

| | | | |
|---|---|---|---|
| 7,434,469 B2* | 10/2008 | Hedtke | 73/706 |
| 7,516,914 B2* | 4/2009 | Kovacevich et al. | 242/388.8 |
| 7,784,727 B1* | 8/2010 | Liao | 242/378.1 |
| 8,365,887 B2* | 2/2013 | Fischer | 191/12.2 R |
| 8,387,763 B2* | 3/2013 | Burke et al. | 191/12.2 R |
| 8,720,810 B2* | 5/2014 | Whitaker | 242/388.6 |
| 8,800,907 B2* | 8/2014 | Koenig et al. | 242/379 |
| 8,811,646 B1* | 8/2014 | Romeo | 381/370 |
| 2002/0023814 A1* | 2/2002 | Poutiatine | 191/12.2 R |
| 2004/0097273 A1* | 5/2004 | Chiang | 455/569.1 |
| 2004/0200920 A1* | 10/2004 | Wei | 242/378.4 |
| 2004/0256188 A1* | 12/2004 | Harcourt | 191/12.2 A |
| 2006/0006038 A1* | 1/2006 | Beverlin | 191/12.2 R |
| 2006/0186248 A1* | 8/2006 | Liao | 242/378 |
| 2007/0194162 A1* | 8/2007 | Ito | 242/385.2 |
| 2008/0227380 A1* | 9/2008 | Hsu et al. | 454/184 |
| 2009/0083847 A1* | 3/2009 | Fadell et al. | 726/16 |
| 2009/0091900 A1* | 4/2009 | Kang | 361/755 |
| 2009/0101743 A1* | 4/2009 | Chang | 242/385.2 |
| 2010/0077810 A1* | 4/2010 | De Franceschi | 70/283.1 |
| 2013/0153701 A1* | 6/2013 | Huang et al. | 242/385.2 |

* cited by examiner

CONTAINER FOR ACCOMMODATING CABLE THEREIN AND ELECTRONIC DEVICE ASSEMBLY WITH SAME

BACKGROUND

1. Technical Field

The present disclosure relates to containers for electrical cables and the like, and more particularly, to a container for accommodating a cable of an electronic device. The disclosure also relates an electronic device assembly having the container.

2. Description of Related Art

An electronic device such as a cellular phone or the headphones of a music player usually uses a long cable for transmitting electrical signals. However, the long cable is easily tangled when the electronic device is put away, which is inconvenient and bothersome for use the next time.

Therefore, it is desirable to provide a means which can overcome the above-mentioned problems.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Embodiments of the present disclosure will now be described in detail below, with reference to the accompanying drawings.

Figure 1:
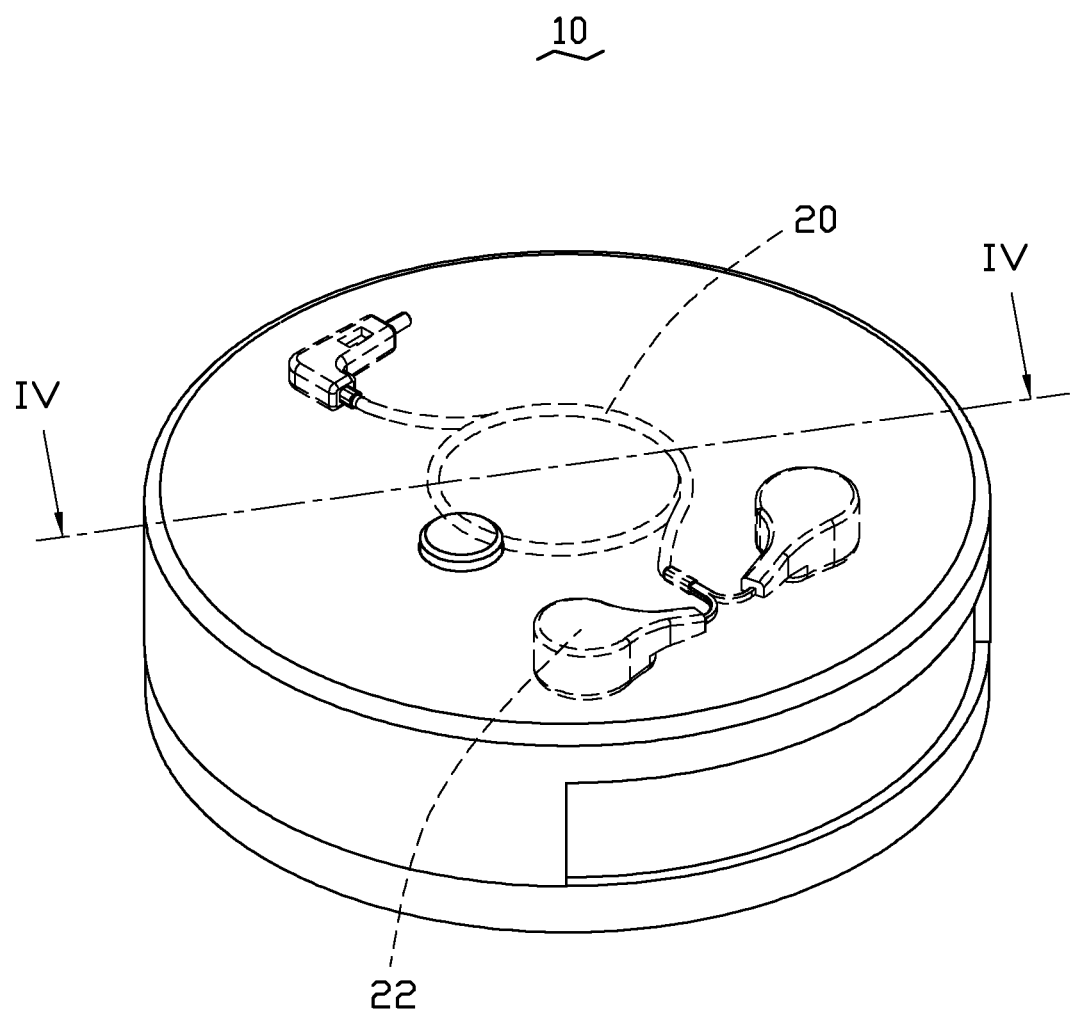
FIG. 1 is an isometric view of a container for accommodating a cable of an electronic device according to an exemplary embodiment, showing part of the cable and the electronic device in phantom.
Figure 2:
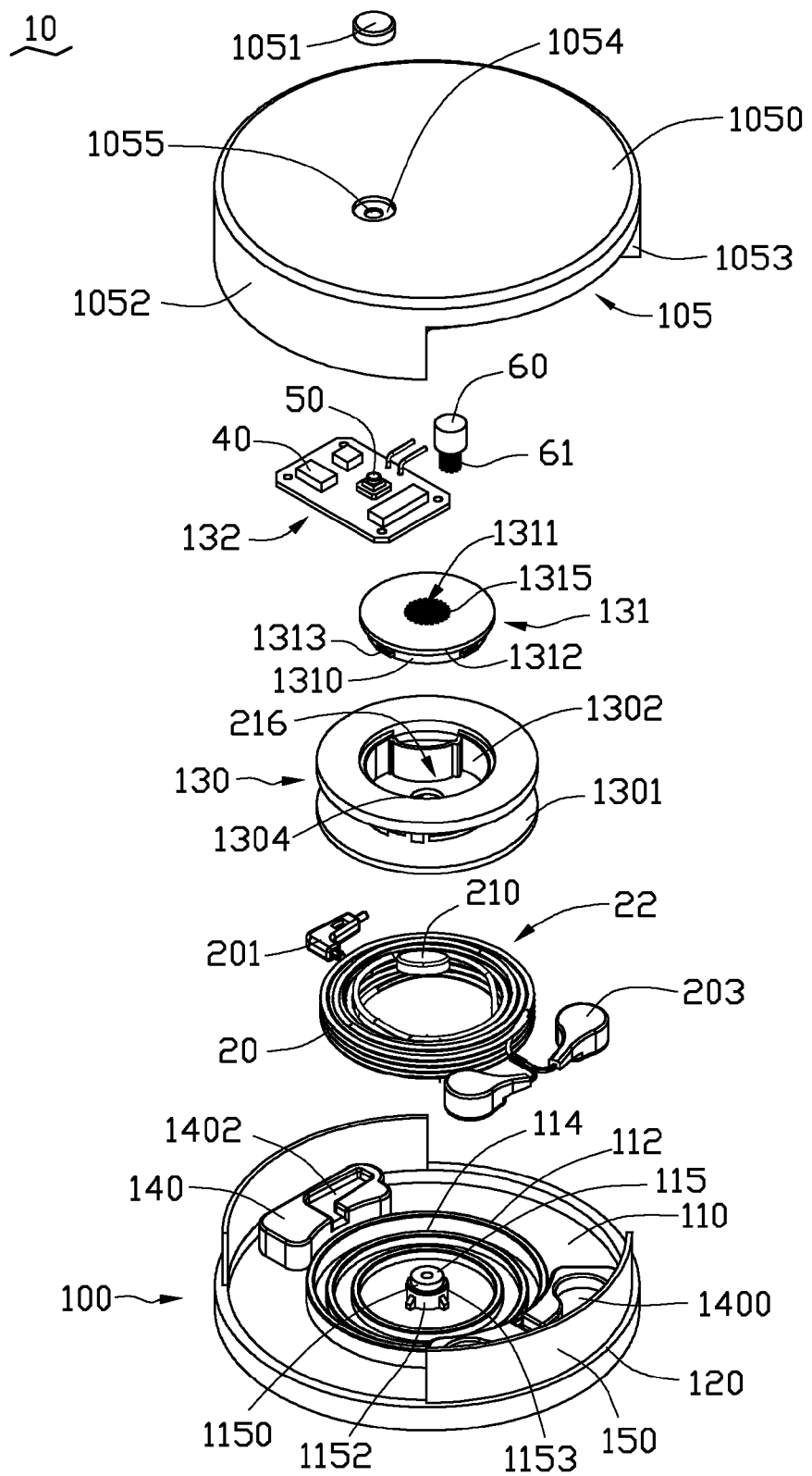
FIG. 2 is an exploded view of the container of FIG. 1, together with the cable and the electronic device.

FIGS. 1-2 illustrate a container 10 in accordance with an exemplary embodiment. The container 10 is configured for accommodating a cable 20 of an electronic device 22. The electronic device 22 may be, for example, a pair of earphones of a music player or of a cellular phone. In the illustrated example, the electronic device 22 is a pair of earphones, and the container 10 is configured for accommodating the entire electronic device 22 including the cable 20. The container 10 may include a base 100, a cover 105, a winder 130, a driving apparatus 132, a transmission piece 131, a pair of receiving blocks 140, and a pair of shielding boards 150. The cover 105 is connected to the base 100 and defines a first receiving space 160 (see FIG. 4) in cooperation with the base 100. The winder 130 is received in the first receiving space 160, and the cable 20 is wrapped on the winder 130. The electronic device 22 is provided with a sensing apparatus 210, which senses whether the electronic device 22 is being used. When the electronic device 22 is not being used, the sensing apparatus 210 detects such state of the electronic device 22, and the driving apparatus 132 correspondingly drives the winder 130 to rotate and thereby wind up the cable 20.

The base 100 includes a bottom board 110, an outer sidewall 120, a positioning sidewall 112, a number of support sidewalls 114, and a holding post 115. The outer sidewall 120 extends up from a periphery of the bottom board 110. The positioning sidewall 112, the support sidewalls 114, and the holding post 115 extend up from a top surface of the bottom board 110 in a direction parallel to the outer sidewall 120. The positioning sidewall 112 encircles the support sidewalls 114. In the illustrated embodiment, there are two support sidewalls 114. The radius of the support sidewall 114 close to the holding post 115 is less than the radius of the support sidewall 114 far from the holding post 115. The holding post 115 is encircled by the inner support sidewall 114. The height of the positioning sidewall 112 is greater than the height of the support sidewalls 114. In this embodiment, the bottom board 110 is circular. The holding post 115 is located on the center of the bottom board 110.

The holding post 115 includes an upper part 1150 and a lower part 1152. The radius of the upper part 1150 is less than the radius of the lower part 1152. Thus, a step 1153 is formed at an intersection between the upper part 1150 and the lower part 1152.

Figure 4:
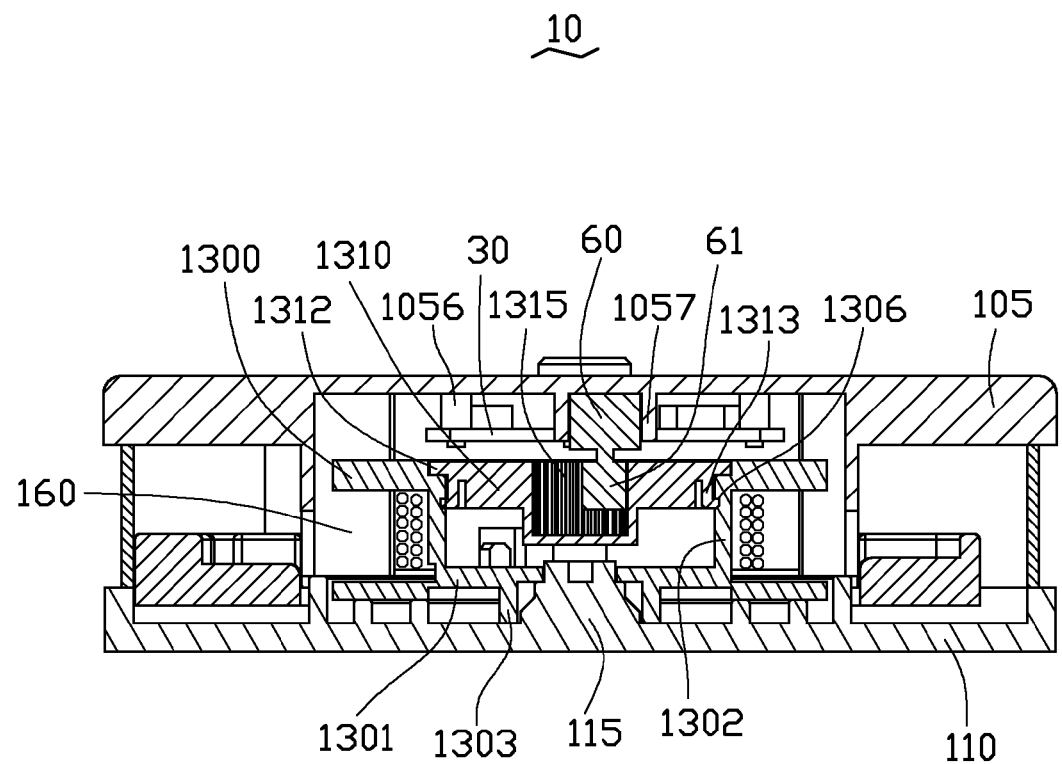
FIG. 4 is a cross-sectional view taken along line IV-IV of FIG. 1, showing an internal assembly of the container.

The winder 130 includes an upper board 1300, a lower board 1301, a connecting sidewall 1302, and a bottom sidewall 1303 (see FIG. 4). The winder 130 defines a bottom through hole 1304 in the lower board 1301. The connecting sidewall 1302 extends up from a top surface of the lower board 1301, and can be considered to encircle the bottom through hole 1304. The bottom sidewall 1303 extends from a bottom surface of the lower board 1301. The bottom sidewall 1303 can be considered to encircle the bottom through hole 1304. The radius of the bottom through hole 1304 is larger than the radius of the upper part 1150, and is less than the radius of the lower part 1152. An inner radius of the bottom sidewall 1303 is slightly larger than the radius of the lower part 1152. The connecting sidewall 1302 and the lower board 1301 cooperatively define a second receiving space 216 for receiving the transmission piece 131.

The upper board 1300 radially extends from a top periphery of the connecting sidewall 1302. The upper board 1300 is parallel to the lower board 1301. An outer radius of the upper board 1300 is the same as an outer radius of the lower board 1301.

The winder 130 defines a number of positioning grooves 1306 (as shown in FIG. 4) in an inner surface of the connecting sidewall 1302. The positioning grooves 1306 are close to the upper board 1300, and distributed along a peripheral direction of the connecting sidewall 1302 at predetermined intervals.

The transmission piece 131 includes a connecting base 1310, a holding flange 1312, and a number of connecting hooks 1313. The transmission piece 131 defines a circular engaging recess 1311 in the connecting base 1310. The engaging recess 1311 is exposed at a top of the connecting base 1310. The transmission piece 131 forms a number of teeth 1315 on a circumferential inner wall of the engaging recess 1311. The holding flange 1312 radially extends from an upper periphery of the connecting base 1310, with a top surface of the holding flange 1312 being coplanar with a top surface of the connecting base 1310. The connecting hooks 1313 extend down from a bottom surface of the holding flange 1312 and are distributed along a peripheral direction of the holding flange 1312 at predetermined intervals. Each connecting hook 1313 has an L-shaped transverse cross-section.

The cover 105 includes a top board 1050, a button 1051, and a limiting sidewall 1052. The limiting sidewall 1052 extends down from a periphery of the top board 1050, and defines a pair of opposite cutouts 1053 corresponding to the shielding boards 150. The cover 105 defines a button recess 1504 in a top surface of the top board 1050. The cover 105 also defines a trigger through hole 1055 in the top board 1050, the trigger through hole 1055 being located below and in communication with the button recess 1054. The top board 1050 includes a number of fastening posts 1056 and a receiving collar 1057. The fastening posts 1056 and the receiving collar 1057 are formed on a bottom surface of the top board 1050.

One of the receiving blocks 140 defines a first receiving groove 1400. The other one of the receiving blocks 140 defines a second receiving groove 1402. The shielding boards 150 are configured for shielding the receiving blocks 140 when the receiving blocks 140 are assembled in the container 10.

Figure 3:
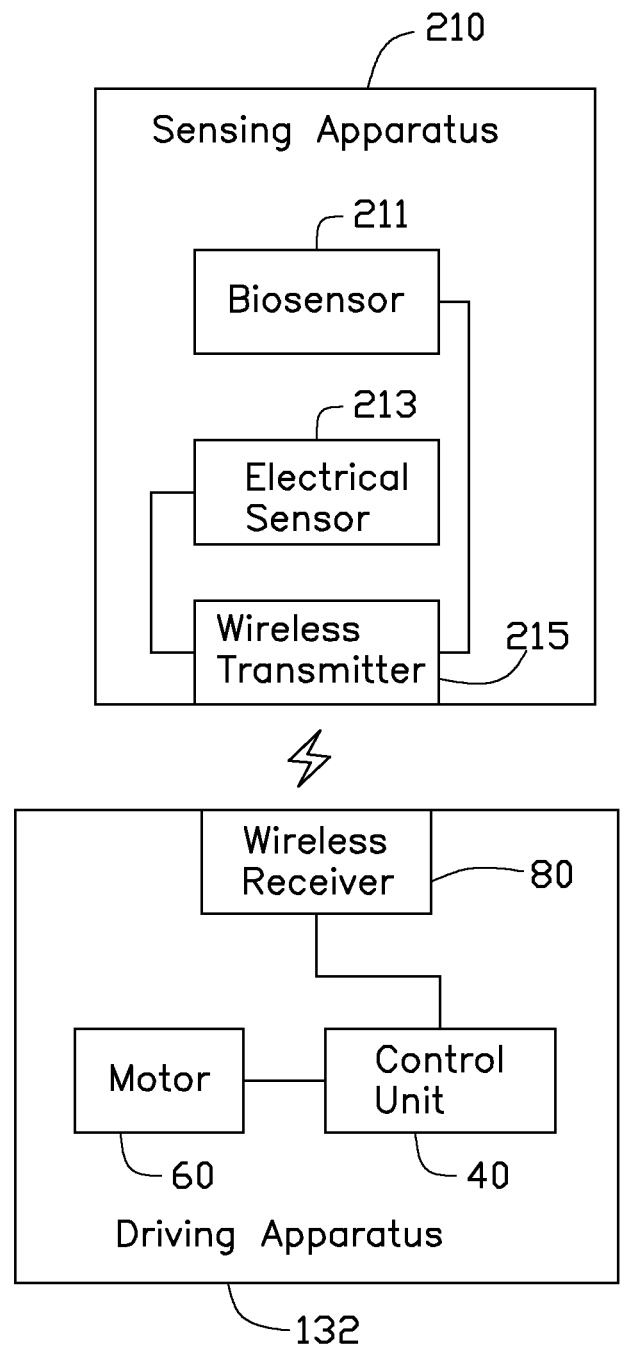
FIG. 3 is a block diagram of a sensing apparatus and a driving apparatus of the electronic device and the container of the exemplary embodiment.

The sensing apparatus 210 is set on the electronic device 22 and operatively connected to the driving apparatus 132 via wireless communication. Referring also to FIG. 3, the sensing apparatus 210 includes a wireless transmitter 215, and at least one of a biosensor 211 and an electrical sensor 213. The biosensor 211 senses a biological sign of the presence of a human being, such as the body temperature of a human, and transmits a first sensing signal to the driving apparatus 132 via the wireless transmitter 215. The electrical sensor 213 senses an electrical parameter of the electronic device 22, and transmits a second sensing signal to the driving apparatus 132 via the wireless transmitter 215. In this embodiment, the electronic device 22 is the pair of earphones, which also includes a pair of earpieces 203, a connector 201, and a cable 20 interconnecting the pair of earpieces 203 and the connector 201. The biosensor 211 is set on either or both of the earpieces 203, for example. The electrical sensor 213 is set on the connector 201, for example. In the description that follows, unless the context indicates otherwise, it is assumed that the sensing apparatus 210 includes only the biosensor 211 or only the electrical sensor 213.

The driving apparatus 132 comprises a circuit board 30, a control unit 40, a trigger 50, a wireless receiver 80, and a motor 60. The control unit 40 and the trigger 50 are mounted on the circuit board 30. The motor 60 includes a gear 61. The gear 61 rotates in a predetermined direction when the motor 60 is working under the command of the control unit 40. In one example, the control unit 40 receives the first sensing signal via wireless communication between the wireless transmitter 215 and the wireless receiver 80, and thereby determines that the electronic device 22 is in contact with a human being. Then when the control unit 40 does not receive the first sensing signal for a predetermined time period, the control unit 40 determines that the electronic device 22 is not in use, and generates a drive command. The drive command is transmitted to the motor 60 to actuate the motor 60, and thereby the gear 61 rotates to wind up the cable 20. In another example, the control unit 40 receives the second sensing signal, and thereby determines that the electronic device 22 is working. Then when the control unit 40 does not receive the second sensing signal for a predetermined time period, the control unit 40 determines that the electronic device 22 is not in use, and generates the drive command. The drive command is transmitted to the motor 60 to actuate the motor 60, and thereby the gear 61 rotates to wind up the cable 20.

FIGS. 2 and 4 show that in assembly, the winder 130 is sleeved on the holding post 111. In detail, the upper part 114 is passed through the bottom through hole 233 and then the bottom sidewall 232 encircles the lower part 112. An inner periphery of the lower board 1301 at the bottom through hole 232 is supported by the step 113. Other portions of the lower board 1301 are supported on the support sidewalls 114, and an outer periphery of the lower board 1301 is restricted by the positioning sidewall 112. The winder 130 is thus received in the first receiving space 160.

The connecting base 1310 is fixed in the second receiving space 216 by the connecting hooks 1313 correspondingly inserting into the positioning grooves 1306 of the inner surface of the connecting sidewall 1302. The circuit board 30 is fastened to the fastening posts 1056. Thus, the trigger 50 of the circuit board 30 protrudes up through the trigger through hole 1055 into the button recess 1054. The motor 60 is received in the receiving collar 1057 and electrically connected to the control unit 40.

The cover 105 covers the base 100. The gear 61 is inserted into the engaging recess 1311 and engages with some of the teeth 1315. The button 1051 is received in the button recess 1054 and lightly contacts the trigger 50.

The cable 20 of electronic device 22 is wrapped on an outer surface of the connecting sidewall 1302. The receiving blocks 140 are correspondingly placed at two opposite positions between the outer sidewall 120 and the positioning sidewall 112. The earpieces 203 and the connector 201 are correspondingly received in the first receiving groove 1400 and the second receiving groove 1402. The shielding boards 150 correspondingly shield the cutouts 1053, which improves the aesthetic appearance of the container 10.

In use of the container 10, in a first embodiment, the control unit 40 determines whether the electronic device 22 is in use by analyzing input sent from the biosensor 211. When the earpieces 203 are in contact with a user, the biosensor 211 senses a first temperature of the user, generates the first sensing signal, and transmits the first sensing signal to the control unit 40 via wireless communication. The control unit 40 determines that the earpieces 203 are being used by the user, and shuts the motor 60 down (or the motor 60 remains shut down). Thus, the user can pull the cable 20 out of the winder 130 by hand. When the earpieces 203 are not in contact with the user for the predetermined time period, the biosensor 211 senses a second temperature of environment, which is lower than the first temperature of the human body. Under this condition, the biosensor 211 either does not transmit the first sensing signal to the control unit 40, or transmits a reversal first sensing signal to the control unit 40. The control unit 40 determines that the earpieces 203 are not in use if the control unit 40 does not receive the first sensing signal for the predetermined time period, or if the control unit 40 receives the reversal first sensing signal. Upon making such determination, the control unit 40 transmits the drive command to the motor 60 for driving the winder 130 to wind up the cable 20.

In a second embodiment, the control unit 40 determines whether the electronic device 22 is in use by analyzing input sent from the electrical sensor 213. When the connector 201 is connected to an external device, such as a cellular phone or a music player, the electrical sensor 213 generates the second sensing signal, and transmits the second sensing signal to the control unit 40 via wireless communication. The control unit 40 determines that the electronic device 22 is in use and shuts the motor 60 down (or the motor 60 remains shut down). Thus, the user can pull the cable 20 out of the winder 130 by hand. When the control unit 40 does not receive the second sensing signal for the predetermined time period, the control unit 40 determines that the electronic device 22 is not in use.

Upon making such determination, the control unit 40 transmits the drive command to the motor 60 for driving the winder 130 to wind up the cable 20.

In a third embodiment, the user also can control the rotation of the winder 130 with the button 1051. The trigger 50 generates a shift signal to the control unit 40 each time the trigger 50 is pressed by the button 1051. The control unit 40 presets two working modes of the motor 60, such as rotating at a first direction (and thus winding up the cable 20) and stopping. Each time the control unit 40 receives the shift signal, the control unit 40 switches between the two working modes by shifting from a current one of the working modes to the other working mode. Thus, the user can stop the winder 130 by pressing the button 1051 once while the winder 130 is rotating; and can begin or restart the rotation of the winder 130 by pressing the button 1051 again.

While various exemplary and preferred embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A container for accommodating a cable of an electronic device, the container comprising:
    a base comprising a bottom board and a holding post extending up from a center of the bottom board, the holding post comprising an upper part and a lower part, wherein the radius of the upper part is less than the radius of the lower part, and a step is formed at an intersection between the upper part and the lower part;
    a cover placed on the base and defining a receiving space in cooperation with the base;
    a winder received in the receiving space and rotatably connected to the holding post of the base, the upper part received in the winder;
    a transmission piece fastened to the winder; and
    a driving apparatus fixed on the cover and operatively engaged with the transmission piece, the driving apparatus comprising a trigger;
    wherein the trigger generates a shift signal to the driving apparatus each time the trigger is pressed by a user, the shift signal shifts the driving apparatus between adjacent working modes of a predetermined cycle of working modes of the driving apparatus, and the driving apparatus drives the winder to rotate via the transmission piece for winding up the cable on the winder according to one of the working modes.

2. The container of claim 1, wherein the winder comprises an upper board, a lower board, and a connecting sidewall, the winder defines a bottom through hole in the lower board, the connecting sidewall extends up from a top surface of the lower board and encircles the bottom through hole, and the upper board radially extends from a top periphery of the connecting sidewall.

3. The container of claim 2, wherein the upper part is received in the bottom through hole, and the lower board is supported on the step.

4. The container of claim 3, wherein the winder further comprises a bottom sidewall extending from a bottom surface of the lower board, the bottom sidewall encircles the bottom through hole, an inner radius of the bottom sidewall is slightly larger than the radius of the lower part, and the bottom sidewall encircles the lower part.

5. The container of claim 2, wherein the winder defines a plurality of positioning grooves in an inner surface of the connecting sidewall, and the positioning grooves are close to the upper board and distributed along a peripheral direction of the connecting sidewall at predetermined intervals.

6. The container of claim 5, wherein the transmission piece comprises a connecting base, a holding flange, and a plurality of connecting hooks, the holding flange radially extends from an upper periphery of the connecting base, the connecting hooks extend down from a bottom surface of the holding flange and are distributed along a peripheral direction of the holding flange at predetermined intervals, and the connecting hooks are engaged in the positioning grooves thereby fastening the transmission piece to the winder.

7. The container of claim 6, wherein the transmission piece defines an engaging recess in the connecting base, the transmission piece forms a plurality of teeth on a circumferential inner wall of the engaging recess, the driving apparatus comprises a motor, and the motor is fixed on the cover and comprises a gear received in the engaging recess and engaged with some of the teeth.

8. The container of claim 5, wherein the base further comprises a positioning sidewall and a plurality of support sidewalls, the support sidewalls are concentric and encircle the holding post, the positioning sidewall encircles the support sidewalls, a height of the positioning sidewall is greater than a height of the support sidewalls, and the lower board is supported on the support sidewalls and restricted by the positioning sidewall.

9. The container of claim 1, wherein the driving apparatus further comprises a control unit and a motor, and the motor is operatively engaged with the transmission piece to provide rotation force to the winder.

10. The container of claim 9, wherein the driving apparatus stops the winder rotating according to another one of the working modes.

11. An electronic device assembly comprising:
    an electronic device comprising:
        a cable; and
        a sensing apparatus configured to sense whether the electronic device is currently in use, the sensing apparatus comprising a wireless transmitter; and
    a container comprising:
        a base comprising a bottom board and a holding post extending up from a center of the bottom board, the holding post comprising an upper part and a lower part, the radius of the upper part is less than the radius of the lower part, a step is formed at an intersection between the upper part and the lower part;
        a winder rotatably connected to the holding post of the base, the upper part is received in the winder;
        a transmission piece fastened to the winder;
        a cover placed on the base and covering the winder and the transmission piece; and
        a driving apparatus fixed on the cover and operatively connected to the winder via the transmission piece for driving the winder to rotate, the driving apparatus comprising a wireless receiver communicatively connected with the wireless transmitter of the electronic device;
    wherein the driving apparatus is configured to drive the winder to rotate according to at least one sensing signal wirelessly transmitted from the sensing apparatus and thereby wind up the cable on the winder.

12. The electronic device assembly of claim 11, wherein the sensing apparatus comprises a biosensor for sensing a biological sign of the presence of a human being, the biosensor transmits a sensing signal to the driving apparatus when the electronic device is touched by a user.

13. The electronic device assembly of claim 12, wherein the driving apparatus comprises a control unit and a motor, the control unit determines that the electronic device is in contact with the user and shuts the motor down when the control unit receives the first sensing signal.

14. The electronic device assembly of claim 13, wherein the control unit determines that the electronic device is currently not in use when the control unit does not receive the first sensing signal for a predetermined time period, and thereupon transmits a drive command to the motor for driving the winder to wind up the cable.

15. The electronic device assembly of claim 13, wherein the sensing apparatus comprises an electrical sensor for sensing an electrical parameter of the electronic device, and the electrical sensor transmits the sensing signal to the driving apparatus when the electronic device is connected to an external device.

16. The electronic device assembly of claim 15, wherein the driving apparatus comprises a control unit and a motor, the motor engages with the transmission piece to provide a rotation force with the winder, the control unit determines that the electronic device is currently in use and shuts down the motor when the control unit receives the second sensing signal.

17. The electronic device assembly of claim 16, wherein when the control unit does not receive the sensing signal for a predetermined time period, the control unit determines that the electronic device is currently not in use and transmits the drive command to the motor for driving the winder to wind up the cable.

18. A container for accommodating a cable of an electronic device, the container comprising:
    a base comprising a bottom board and a holding post extending up from a center of the bottom board;
    a cover placed on the base and defining a receiving space in cooperation with the base;
    a winder received in the receiving space and rotatably connected to the base, the winder rotatably connected to the holding post, the winder comprising:
        an upper board;
        a lower board including a bottom through hole therethrough; and
        a connecting sidewall, extending up from a top surface of the lower board and encircling the bottom through hole, the upper board radially extending from a top periphery of the connecting sidewall, an inner surface of the connecting sidewall including a plurality of positioning grooves, the positioning grooves in close proximity to the upper board and distributed along a peripheral direction of the connecting sidewall at predetermined intervals;
    a transmission piece connected to the winder, the transmission piece comprising a connecting base, a holding flange, and a plurality of connecting hooks, the holding flange radially extending from an upper periphery of the connecting base, the connecting hooks extending down from a bottom surface of the holding flange and distributed along a peripheral direction of the holding flange at predetermined intervals, the connecting hooks engageable in the positioning grooves thereby fastening the transmission piece to the winder; and
    a driving apparatus fixed on the cover and operatively engageable with the transmission piece, the driving apparatus comprising a trigger operable to generate a shift signal to the driving apparatus when the trigger is activated by a user, the shift signal shifting the driving apparatus between adjacent working modes of a predetermined cycle of working modes of the driving apparatus, the driving apparatus operable to drive the winder to rotate via the transmission piece for winding the cable on the winder according to one of the working modes.

19. The container of claim 18, wherein the transmission piece defines an engaging recess in the connecting base, the transmission piece forms a plurality of teeth on a circumferential inner wall of the engaging recess, the driving apparatus comprises a motor, and the motor is fixed on the cover and comprises a gear received in the engaging recess and engaged with some of the teeth.

\* \* \* \* \*